(12) United States Patent
Chang et al.

(10) Patent No.: US 11,658,187 B2
(45) Date of Patent: May 23, 2023

(54) ELECTRONIC DEVICES

(71) Applicant: InnoLux Corporation, Miao-Li County (TW)

(72) Inventors: Yu-Che Chang, Miao-Li County (TW); Li-Wei Sung, Miao-Li County (TW); Cheng-Tso Chen, Miao-Li County (TW); Hui-Min Huang, Miao-Li County (TW); Chia-Min Yeh, Miao-Li County (TW); Hung-Hsun Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 388 days.

(21) Appl. No.: 16/908,481

(22) Filed: Jun. 22, 2020

(65) Prior Publication Data

US 2021/0013234 A1 Jan. 14, 2021

(30) Foreign Application Priority Data

Jul. 11, 2019 (CN) .......................... 201910625212.1

(51) Int. Cl.
*H01L 27/12* (2006.01)
*G09G 3/32* (2016.01)
*H01L 23/552* (2006.01)
*G09G 3/30* (2006.01)

(52) U.S. Cl.
CPC ............. *H01L 27/124* (2013.01); *G09G 3/30* (2013.01); *G09G 3/32* (2013.01); *H01L 23/552* (2013.01)

(58) Field of Classification Search
CPC ....... H01L 27/124; H01L 23/552; G09G 3/30; G09G 3/32
See application file for complete search history.

(56) References Cited

U.S. PATENT DOCUMENTS

| | | |
|---|---|---|
| 2006/0164352 A1 | 7/2006 | Yoo et al. |
| 2008/0266210 A1 | 10/2008 | Nonaka |
| 2020/0168633 A1* | 5/2020 | Ina ........................ H01L 27/124 |

* cited by examiner

*Primary Examiner* — Anne M Hines
(74) *Attorney, Agent, or Firm* — McClure, Qualey & Rodack, LLP

(57) ABSTRACT

An electronic device is provided. The electronic device includes a substrate, a first gate circuit, a second gate circuit, a signal line, and a shielding layer. The substrate includes a display area and a peripheral area. The first gate circuit is disposed in the peripheral area. The second gate circuit is disposed in the peripheral area. The signal line is coupled between the first gate circuit and the second gate circuit. The signal line includes a specific line segment, and the specific line segment overlaps the display area. The shielding layer is disposed in the display area. The shielding layer overlaps the specific line segment.

20 Claims, 7 Drawing Sheets

ELECTRONIC DEVICES

CROSS REFERENCE TO RELATED APPLICATIONS

This Application claims priority of China Patent Application No. 201910625212.1, filed on Jul. 11, 2019, the entirety of which is/are incorporated by reference herein.

BACKGROUND OF THE DISCLOSURE

Field of the Disclosure

The present disclosure relates to an electronic device, and more particularly to an electronic device having a display panel.

Description of the Related Art

In recent years, non-rectangular displays have gradually emerged in response to market demand. Display manufacturers can provide differently shaped display panels to meet customer's requirements. However, one disadvantage of non-rectangular display panels is that the length of each scan line in the panel may be different, and different scan lines may span different numbers of data lines. In addition, different data lines may have different lengths, and different data lines may span different numbers of scan lines. Therefore, a display with a non-rectangular panel may not show uniform images.

BRIEF SUMMARY OF THE DISCLOSURE

One exemplary embodiment of an electronic device is provided. The electronic device includes a substrate, a first gate circuit, a second gate circuit, a signal line, and a shielding layer. The substrate includes a display area and a peripheral area. The first gate circuit is disposed in the peripheral area. The second gate circuit is disposed in the peripheral area. The signal line is coupled between the first gate circuit and the second gate circuit. The signal line includes a specific line segment, and the specific line segment overlaps the display area. The shielding layer is disposed in the display area. The shielding layer overlaps the specific line segment.

Another exemplary embodiment of an electronic device is provided. The electronic device comprises a substrate, a first gate circuit, a second gate circuit, a data circuit, a signal line, and a shielding layer. The substrate includes a display area and a peripheral area. The first gate circuit is disposed in the peripheral area and transmits a first scan signal to a first scan of the display area. The second gate circuit is disposed in the peripheral area and transmits a second scan signal to a second scan line of the display area. The data circuit is disposed between the first gate circuit and the second gate circuit and transmits an image signal to a data line of the display area. The signal line is coupled between the first gate circuit and the second gate circuit. The signal line transmits a control signal and comprises a specific line segment. The specific line segment overlaps the display area. The shielding layer is disposed in the display area and overlaps the specific line segment.

A detailed description is given in the following embodiments with reference to the accompanying drawings.

BRIEF DESCRIPTION OF THE DRAWINGS

The full disclosure is based on the following detailed description and in conjunction with the drawings. It should be noted that the illustrations are not necessarily drawn to scale in accordance with the general operation of the industry. In fact, it is possible to arbitrarily enlarge or reduce the sizes of the components for a clear explanation.

DETAILED DESCRIPTION OF THE DISCLOSURE

Figure 1:
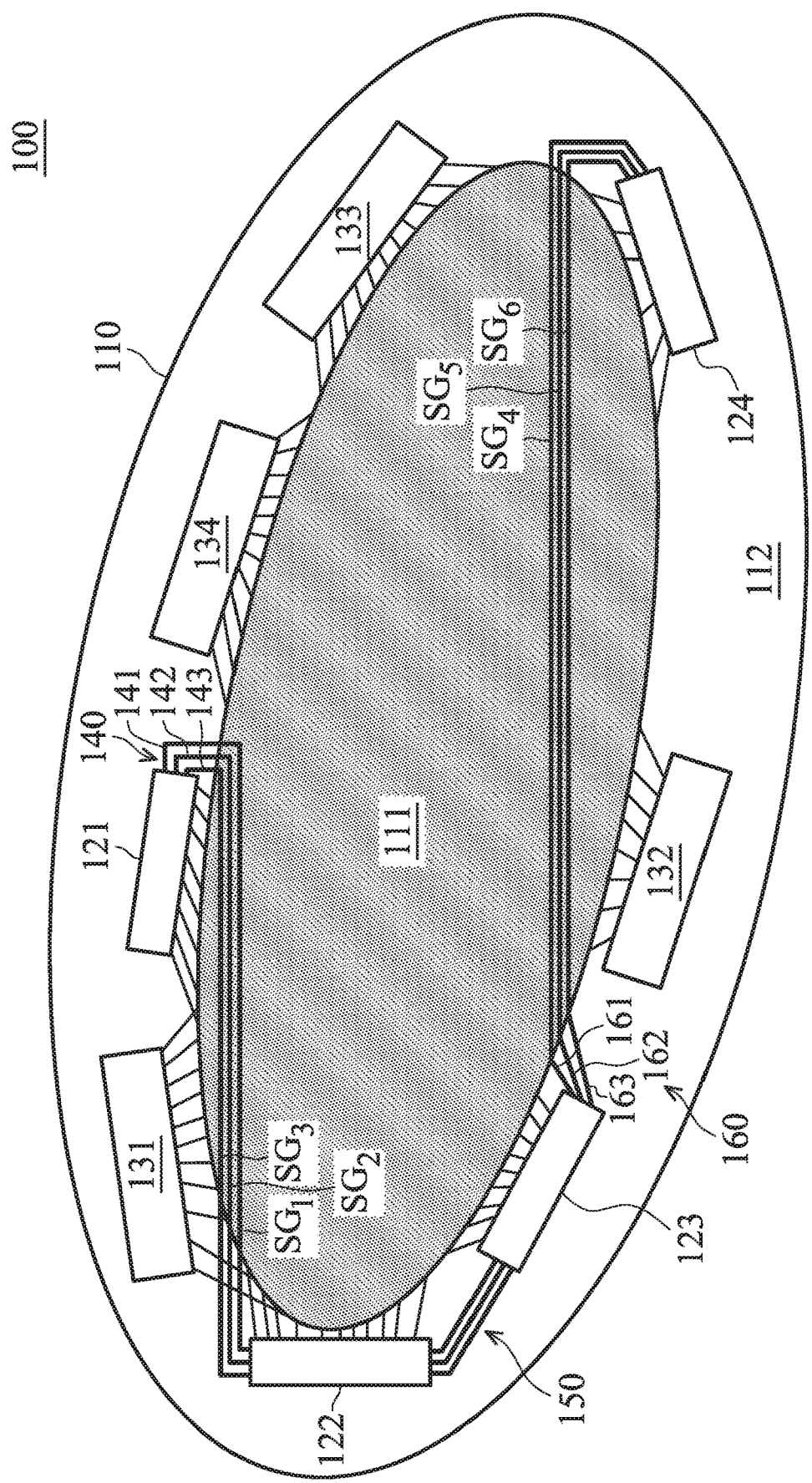
FIG. 1 is a schematic diagram showing one exemplary embodiment of an electronic device of the disclosure.

The present disclosure will be described with respect to particular embodiments and with reference to certain drawings, but the present disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the present disclosure.

The ordinal numbers used in the specification and claims, such as "first", "second", etc., are used to name the components of the claims. They are not intended to imply any sequential relationship between the claimed components or any order of steps in a manufacturing method. These ordinal numbers are used to clearly distinguish the components with the same name.

FIG. 1 is a schematic diagram of an exemplary embodiment of an electronic FIG. 1 is a schematic diagram of an exemplary embodiment of an electronic device of the disclosure. As shown in FIG. 1, the electronic device 100 includes a substrate 110, gate circuits 121~124, data circuits 131~134, and signal line groups 140, 150, and 160. The present disclosure does not limit the type of electronic device 100. In an embodiment, the electronic device 100 may include a display device, an antenna device, a sensing device, or a tiled device, however, the present disclosure is not limited thereto. In other embodiments, the electronic device 100 may be a bendable or flexible electronic device. In some embodiments, the electronic device 100 may include, for example, a liquid-crystal display (LCD) or a light-emitting diode display, but present disclosure is not limited thereto. In the present disclosure, the light-emitting diode may include, for example, an organic light-emitting diode (OLED), a sub-millimeter light-emitting diode (mini LED), a micro light-emitting diode (micro LED) or a quantum dot light-emitting diode (QLED or QDLED). In other embodiments, the light-emitting diode includes a fluorescent material, a phosphor material, another suitable material, or a combination of the foregoing materials, however, the present disclosure is not limited thereto. In an embodiment, the antenna device may be a liquid-crystal antenna, however, the present disclosure is not limited thereto. In addition, the tiled device may be, for example, a tiled display device or an tiled antenna device, however, the present disclosure is not limited thereto. It should be noted that the electronic device can be an arbitrary combination of the foregoing elements/devices, however, the present disclosure is not limited thereto. In the following, a display panel or a tiled device is taken as an example to explain the content of the present disclosure, however, the present disclosure is not limited thereto.

The substrate 110 of the electronic device 100 is a non-rectangular substrate and includes a display area 111 and a peripheral area 112. In the embodiment, the shape of the display area 111 is a non-rectangular. The gate circuits 121~124 are disposed in the peripheral area 112 outside the display area 111 for transmitting signals to scan lines of the display area 111. In some embodiments, the gate circuits 121~124 are directly formed on the substrate 110, and, thus, the structure of the gate circuits 121~124 used in the electronic device may be referred to as a GOP (gate on panel) structure. In some embodiments, two of the gate circuits 121~124 are coupled to two ends of the same scan line. For example, the gate circuit 121 is coupled to the right end of a scan line, and the gate circuit 122 is coupled to the left end of this scan line. In some embodiments, the gate circuits 121~124 are coupled to different scan lines. The gate circuit transmits scan signals through the scan lines to control the on or off states of the pixels coupled to the scan lines.

The data circuits 131~134 are also disposed in the peripheral area 112 for providing image signals to data lines of the display area 111. In some embodiments, the data circuits 131~134 are packaged by using a chip-on-film (COF) technology or a chip-on-glass (COG) technology.

The signal line groups 140, 150, and 160 are respectively coupled between the two gate circuits for transmitting control signals (such as clock signals, power supply, and reset signals). In this embodiment, each of the signal line groups 140~160 has a plurality of signal lines. Using the signal line group 140 as an example, the signal line group 140 has signal lines 141~143. One end of each of the signal lines 141~143 is connected to the gate circuit 121, and the other end of each of the signal lines 141~143 is connected to the gate circuit 122, however, the present disclosure is not limited thereto.

Since the shape of the display area 111 of the non-rectangular display panel is non-rectangular, in order to match the shape of the display area 111, the gate circuits 121~124 need to be disposed around the display area 111. Similarly, the data circuits 131~134 also need to be disposed around the display area 111. As shown in FIG. 1, in some embodiments, due to the shape of the panel, some signal lines between the gate circuits cannot be disposed in the peripheral area 112, or some signal lines between the gate circuits need to pass through the display area 111 in the cases where at least one of the data circuits 131~134 is disposed between two gate circuits.

Using the gate circuits 121 and 122 as an example, since the data circuit 131 is disposed between the gate circuits 121 and 122, the signal line group 140 between the gate circuits 121 and 122 passes through the display area 111. In the embodiment, the line segments of the signal lines 141~143 which pass through the display area 111 or overlap the display area 111 are called specific line segments $SG_1$~$SG_3$. In other words, the length of the signal line 141 is greater than or equal to the length of the specific line segment $SG_1$. Similarly, since the data circuit 132 is disposed between the gate circuits 123 and 124, the signal line group 160 connecting the gate circuits 123 and 124 extends through the display area 111. In this embodiment, the specific line segments $SG_4$~$SG_6$ of the signal lines 161~163 of the signal line group 160 are in the display area 111. Similarly, in the present disclosure, the length of each signal line is also greater than or equal to the length of the corresponding specific line segment.

In addition, there is no data circuit between the gate circuits 122 and 123. Thus, the signal line group 150 coupled to the gate circuits 122 and 123 can extend in the non-display area 112 without entering the display area 111.

In order to reduce the influence of the electric fields of the specific line segments $SG_1$~$SG_6$ on the potential of other wirings (such as the scan lines or data lines), at least one shielding layer (not shown) overlaps the specific line segments $SG_1$~$SG_6$. It should be noted that in the present disclosure, the description "a component overlaps another component" means that one component will cover at least one portion of the other component when viewing in a normal direction of the substrate where the two components are disposed, but it does not mean that the two components need to be in direct contact with each other. In an embodiment, a single shielding layer overlaps at least one specific line segment, however, the present disclosure is not limited thereto. In other embodiments, the display area 111 may include a plurality of shielding layers, and the number of the specific line segments overlapping one shielding layer may be the same as or different from the number of the specific line segments overlapping another shielding layer. In addition, in some embodiments, the plurality of shielding layers may be on the same layer or different layers, or the plurality of shielding layers may include the same material or different materials, however, the present disclosure is not limited thereto. For example, a first shielding layer may overlap three specific line segments (such as $SG_1$~$SG_3$), and a second shielding layer may also overlap three specific line segments (such as $SG_4$~$SG_6$). In another embodiment, a first shielding layer may overlap one specific line segment (such as $SG_1$), a second shielding layer may overlap two specific line segments (such as $SG_2$ and $SG_3$), and a third shielding layer may overlap one specific line segment (such as $SG_4$), two specific line segments (such as $SG_4$ and $SG_5$), or three specific line segments (such as $SG_4$~$SG_6$). It should be noted that the present disclosure does not intend to limit the number of specific line segments which one shielding layer overlaps with, or that the present disclosure is not limited to that the shielding layer must completely overlap a corresponding specific line segment. The shielding layer can overlap only one portion of a corresponding specific line segment(s), or different shielding layers overlap different portions of a corresponding specific line segment. In the embodiment, each specific line segment overlaps at least one shielding layer.

Figure 2:
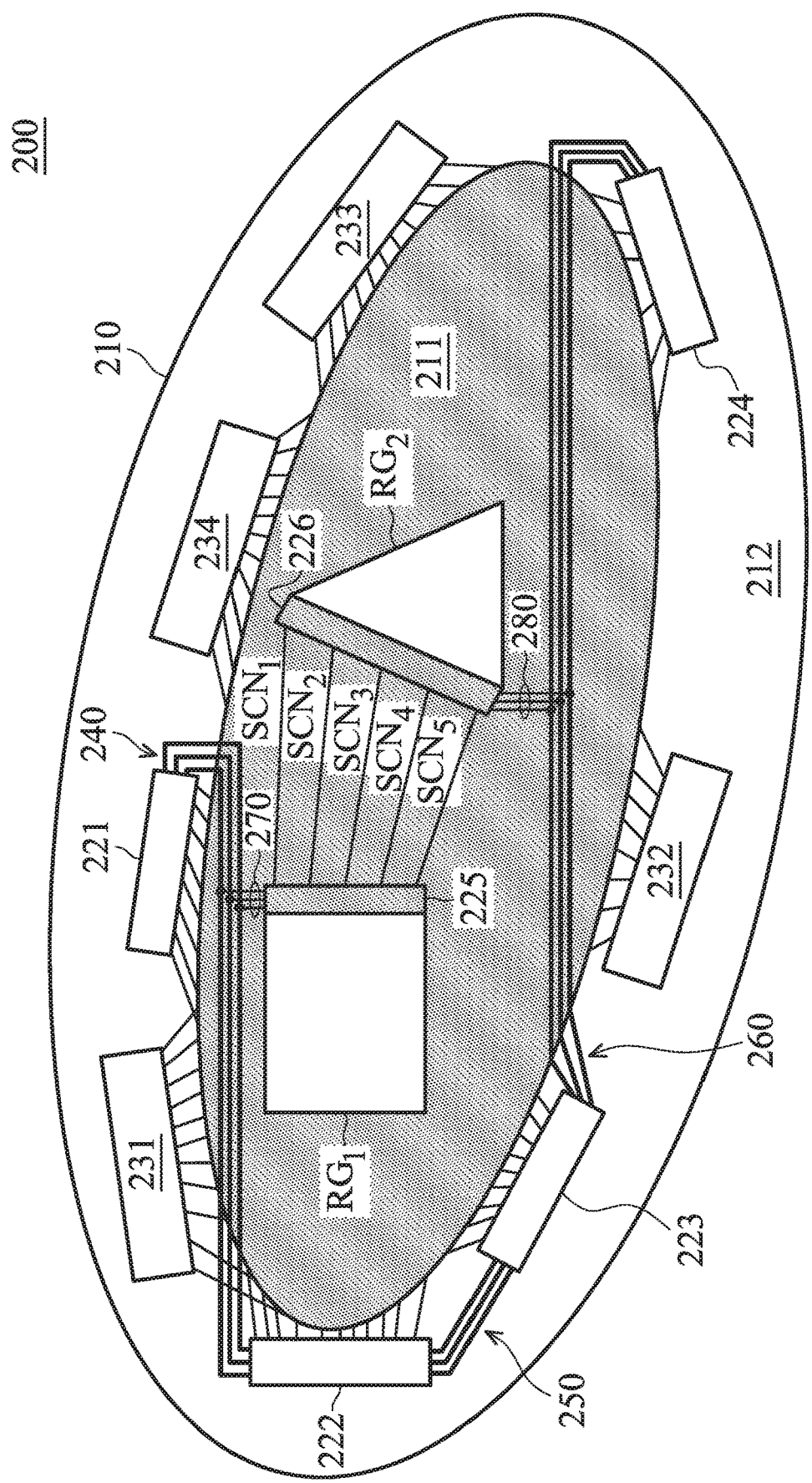
FIG. 2 is a schematic diagram showing another exemplary embodiment of an electronic device of the disclosure.

FIG. 2 is a schematic diagram showing another exemplary embodiment of an electronic device of the disclosure. The embodiment of FIG. 2 is similar to the embodiment of FIG. 1 except that a substrate 210 of FIG. 2 has hollow regions $RG_1$ and $RG_2$ which are disposed in a display area 211 of the substrate 210. In the embodiment shown in FIG. 2, the hollow regions $RG_1$ and $RG_2$ can penetrate the substrate 210. The present disclosure does not intend to limit the number of hollow regions or the characteristics, such as shapes or depths, of the hollow regions. For example, in this embodiment, the shape of the hollow region $RG_1$ is different from the shape of the hollow region $RG_2$. In other embodiments, the substrate 210 may include more or less hollow regions, or there are changes in the shapes of the hollow regions. In some embodiments, the depths of the hollow regions are less, and the hollow regions cannot penetrate the substrate 210.

In the embodiment, the substrate 210 further includes gate circuits 225 and 226 and signal line groups 270 and 280. Since the characteristics of the gate circuits 221~224 and the data circuits 231~234 shown in FIG. 2 are similar to the characteristics of the gate circuits 121~124 and the data circuits 131~134 shown in FIG. 1, the related description is omitted here. In addition, the characteristic of the signal line group 240 shown in FIG. 2 is similar to the characteristic of the signal line group 140 shown in FIG. 1, and the related description is omitted here.

The gate circuit 225 is disposed on at least one side of the hollow region $RG_1$ and is coupled to the scan lines (such as $SCN_1$~$SCN_5$) between the hollow regions $RG_1$ and $RG_2$. The gate circuit 226 is disposed on at least one side of the hollow region $RG_2$ and is coupled to the scan lines (such as $SCN_1$~$SCN_5$) between the hollow regions $RG_1$ and $RG_2$. In some embodiments, one of the gate circuits 225 and 226 may be omitted. In some embodiments, the design of the scan lines can be changed, or the gate circuits 225 and 226 may be completely omitted.

The signal line group 270 is coupled between the gate circuits 221 and 225, and the signal line group 280 is coupled between the gate circuits 223 and 226. As shown in FIG. 2, all the signal lines of the signal line groups 270 and 280 are in the display area 211. In this embodiment, in order to reduce the influence of the electric fields of the signal line groups 270 and 280 on other electrodes or wirings in the display area 211, at least one shielding layer overlaps the signal line group 270 or 280.

Figure 3:
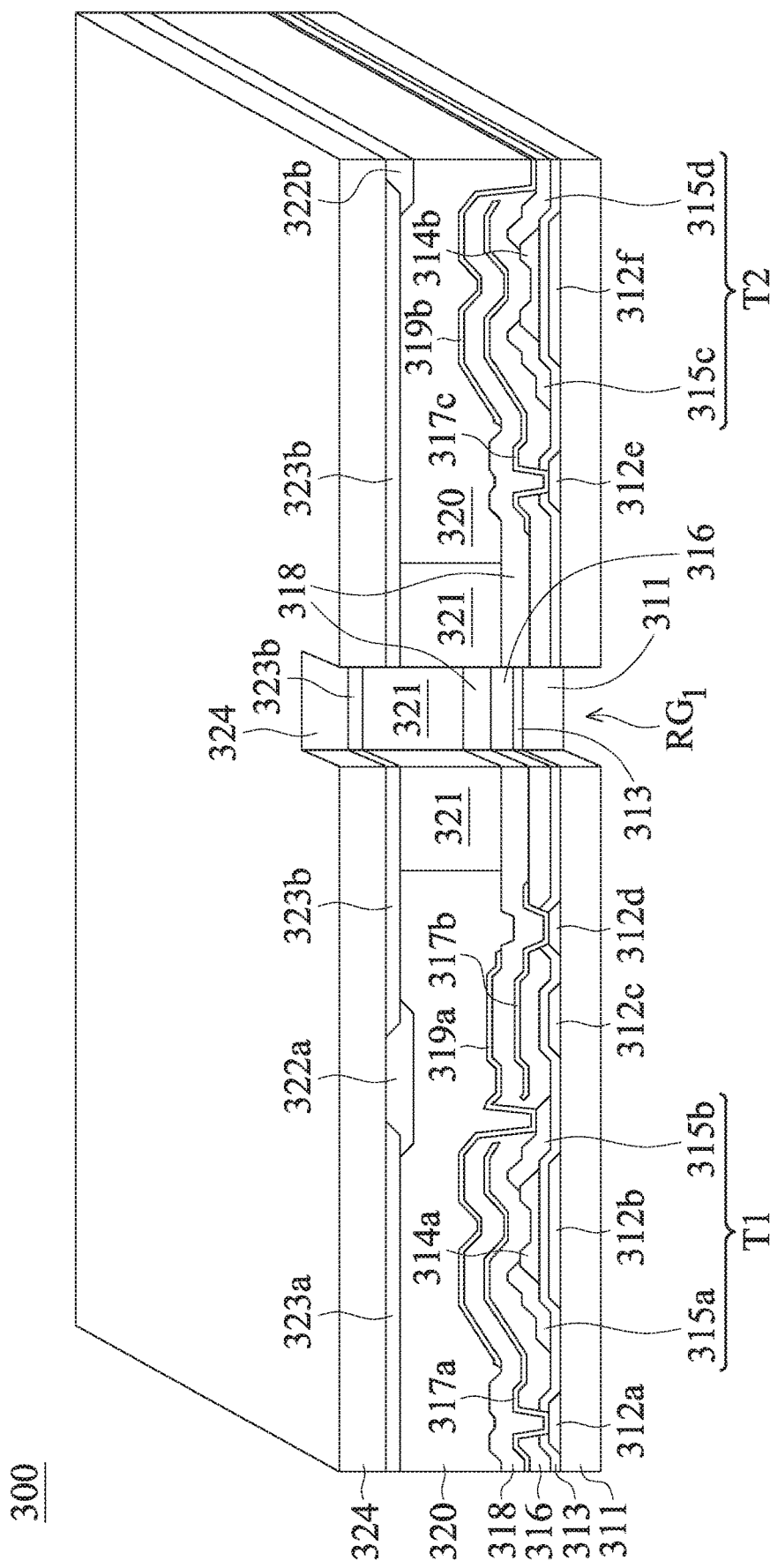
FIG. 3 is a schematic diagram showing a structure of one exemplary embodiment of an electronic device of the disclosure.

FIG. 3 is a schematic diagram showing a structure of one exemplary embodiment of an electronic device of the disclosure. As shown in FIG. 3, an electronic device 300 includes a lower substrate 311. In one embodiment, the lower substrate 311 is a glass substrate, and in other embodiments, the lower substrate 311 may be a flexible substrate, however, the present disclosure is not limited thereto. Electrodes 312a, 312b, and 312d~312f and a specific line segment 312c are disposed on the lower substrate 311. In an embodiment, the electrodes 312a, 312b, and 312d~312f and the specific line segment 312c include the same conductive material or are formed by the same process, however, the present disclosure is not limited thereto. In the embodiment, the electrode 312a is configured to receive a common voltage or a ground voltage. The electrode 312b is a gate. The specific line segment 312c is a specific line segment extending to the display area (such as any one of the specific line segments $SG_1$~$SG_6$ shown in FIG. 1). The electrode 312d is configured to receive a constant voltage, such as a ground voltage or a common voltage. The electrode 312e is another common electrode configured to receive a common voltage or a ground voltage. The electrode 312f is another gate.

An insulating layer 313 overlaps the electrodes 312a, 312b, and 312d~312f and the specific line segment 312c for electrically isolating the electrodes 312a, 312b, and 312d~312f and the specific line segment 312c from each other. In the embodiment, the insulating layer 313 directly contacts, for example, one portion of the lower substrate 311. Two semiconductor layers 314a and 314b are disposed on the insulating layer 313. In the embodiment, the semiconductor layer 314a overlaps the electrode 312b, while the semiconductor layer 314b overlaps the electrode 312f.

Two electrodes 315a and 315b partially overlap the semiconductor layer 314a. In the example, the semiconductor layer 314a, the electrodes 315a, 315b, and 312b form a transistor T1. The electrode 315a serves as the drain of the transistor T1. The electrode 315b serves as the source of the transistor T1. The electrode 312b serves as the gate of the transistor T1. In some embodiments, the electrode 315a serves as the source of transistor T1, and the electrode 315b serves as the drain of transistor T1.

Similarly, two electrodes 315c and 315d partially overlap the semiconductor layer 314b. In the example, the semiconductor layer 314b, the electrodes 315c, 315d, and 312f constitute a transistor T2. The electrode 315c serves as the drain of the transistor T2, the electrode 315d serves as the source of the transistor T2, and the electrode 312f serves as the gate of the transistor T2. In some embodiments, the electrode 315c serves as the source of the transistor T2, and the electrode 315d serves as the drain of the transistor T2. However, in the present disclosure, the transistors T1 and T2 are not limited to the above structures. Moreover, the present disclosure does not intend to limit the materials of the transistors T1 and T2. In the present disclosure, the transistor T1 or T2 may include a-Si, LTPS, IGZO, or other suitable materials, and multiple TFTs may include the same semiconductor material or different semiconductor materials.

An insulating layer 316 overlaps the electrodes 315a~315d and the semiconductor layers 314a and 314b. In the present embodiment, the insulating layer 316 directly contacts, for example, one portion of the insulating layer 313. Two electrodes 317a and 317c and a shielding layer 317b are disposed on the insulating layer 316. In the embodiment, the electrode 317a serves as a common electrode which overlaps the electrodes 315a and 315b and the semiconductor layer 314a and is electrically connected to the electrode 312a. The shielding layer 317b overlaps the specific line segment 312c to reduce the influence of the electric field of the specific line segment 312c on other electrodes or wirings. In the embodiment, the shielding layer 317b is electrically connected to the electrode 312d for receiving a constant voltage, such as a ground voltage or a common voltage. The electrode 317c also serves as another common electrode which overlaps the electrodes 315c and 315d and the semiconductor layer 314b and is electrically connected to the electrode 312e. In another embodiment, the electrode 317c is electrically connected to the shielding layer 317b.

An insulating layer 318 overlaps the electrodes 317a and 317c and the shielding layer 317b. In the embodiment, the insulating layer 318 directly contacts, for example, one portion of the insulating layer 316. Two pixel electrodes 319a and 319b are disposed on the insulating layer 318. In the embodiment, the pixel electrode 319a is electrically connected to the electrode 315b. Since the shielding layer 317b is disposed between the specific line segment 312c and the pixel electrode 319a, the influence of the electric field of the specific line segment 312c on the pixel electrode 319b can be reduced. In addition, the pixel electrode 319b is electrically connected to the electrode 315d.

A display medium layer 320 is disposed on the pixel electrodes 319a and 319b. In the embodiment, the display medium in the display medium layer may be liquid crystal, however, the present disclosure is not limited thereto. In some embodiments, the display medium may be a self-luminous element, such as an organic light-emitting diode (OLED), a sub-millimeter light-emitting diode (mini LED), a micro light-emitting diode (micro LED), or quantum dot light-emitting diode (quantum dot light-emitting diode, QLED or QDLED). In one embodiment, the display medium layer 320 directly contacts, for example, a portion of the insulating layer 318. In this embodiment, since a hollow region (such as $RG_1$ shown in FIG. 1) penetrates the electronic device 300, a sealant 321 is applied around the hollow region $RG_1$ to seal the display medium layer 320, which reduces the possibility of the liquid-crystal of the display medium layer 320 bleeding out from the hollow region (such as $RG_1$ shown in FIG. 1). In the embodiment, the sealant 321 overlaps a portion of the insulating layer 316 and a portion of the insulating layer 318, however, the present disclosure is not limited thereto. In some embodiments, the sealant 321 is disposed between the hollow region $RG_1$ and the insulating layers 316 and 318 to separate the hollow region $RG_1$ from the insulating layers 316 and 318. In other some embodiments, the sealant 321 may be directly contact an upper substrate 324 or the lower substrate 311.

Two color filter layers 322a and 322b are disposed on the display medium layer 320 to filter out partial colors of light.

Two black matrix (BM) 323a and 323b are disposed on the display medium layer 320. In the present embodiment, in the normal-line direction of the upper substrate 324, the black matrix 323a overlaps one portion of the color filter layer 322a, and the black matrix 323b overlaps another portion of the color filter layer 322a. In the embodiment, another portion of the color filter layer 322a does not overlap the black matrix 323a or 323b. In addition, the black matrix 323b overlaps one portion of the color filter layer 322b. In the embodiment, another portion of the color filter layer 322b does not overlap the black matrix 323b, however, the present disclosure is not limited thereto. In some embodiments, the color filter layer 322a or 322b does not overlap the black matrix 323a or 323b.

The upper substrate 324 overlaps the black matrix 323a and 323b and the color filter layers 322a and 322b. In some embodiments, at least one of the upper and lower substrates may be a hard board (such as a glass substrate), a flexible substrate, or a combination thereof, however, the present disclosure is not limited thereto. In the embodiment, the hollow region $RG_1$ penetrates the lower substrate 311, the insulating layers 313, 316, and 318, the display medium layer 320, the black matrix 323b, and the upper substrate 324. In an embodiment, the materials of the insulating layers 313, 316, and 318 include SiNx (silicon nitride) or SiOx (silicon oxide), however, the present disclosure is not limited thereto.

Figure 4A:
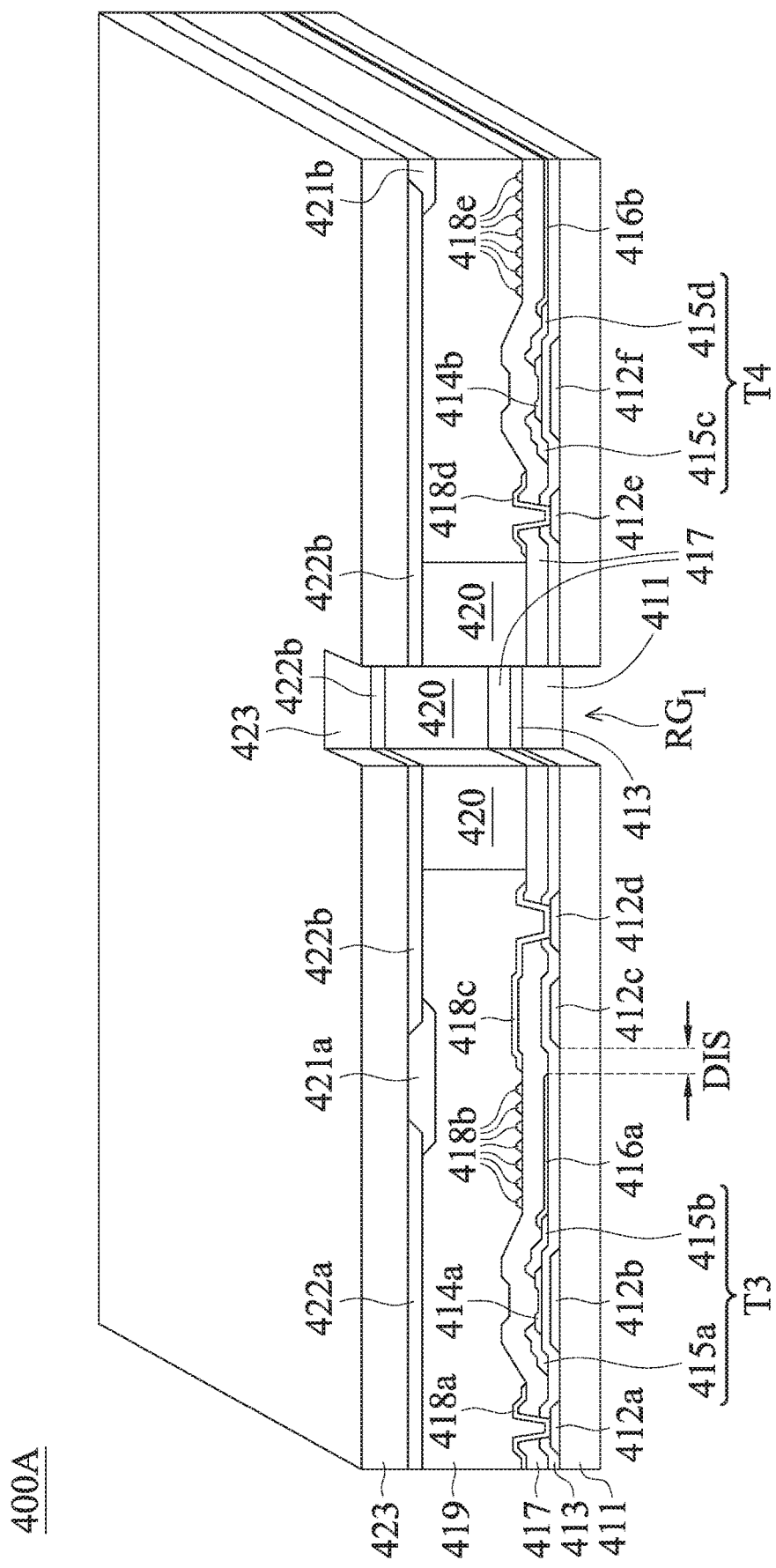
FIG. 4A is a schematic diagram showing a structure of another exemplary embodiment of an electronic device of the disclosure.

FIG. 4A is a schematic diagram showing a structure of another exemplary embodiment of an electronic device of the disclosure. As shown in FIG. 4A, an electronic device 400A includes a lower substrate 411. In one embodiment, the lower substrate 411 is a glass substrate. Electrodes 412a, 412b, and 412d~412f and the specific line segment 412c are disposed on the lower substrate 411, and an insulating layer 413 overlaps electrodes 412a, 412b, and 412d~412f and the specific line segment 412c. The insulating layer 413, the electrodes 412a, 412b, and 412d~412f, and the specific line segment 412c of the embodiment are similar to the insulating layer 313, the electrodes 312a, 312b, and 312d~312f, and the specific line segment 312c of the embodiment shown in FIG. 3 in the positions, materials, manufacturing processes and functions, and, thus, the related description is omitted here.

Similarly, in the embodiment of FIG. 4A, two semiconductor layers 414a and 414b, two electrodes 415a and 415b, two electrodes 415c and 415d, an insulating layer 417 are similar to the semiconductor layers 314a and 314b, the electrodes, 315a and 315b, the electrodes 315c and 315d, and the insulating layer 316 of the embodiment shown in FIG. 3 in the positions, materials, manufacturing processes, and functions, and, thus, the related description is omitted here.

A pixel electrode 416a overlaps one portion of the electrode 415b and one portion of the insulating layer 413. In the embodiment, the projection of the distance between the pixel electrode 416a and the specific line segment 412c on the substrate is defined as a distance DIS. By increasing the distance DIS between the pixel electrode 416a and the specific line segment 412c, the occurrence of interference due to the electric field of the specific line segment 412c on the pixel electrode 416a can be reduced. In one embodiment, a pixel electrode 416b overlaps one portion of the electrode 415d and one portion of the insulating layer 413.

Electrodes 418a, 418b, 418d, and 418e and a shielding layer 418c are disposed on the insulating layer 417. In the embodiment, the electrodes 418a and 418b serve as common electrodes. The electrode 418a is electrically connected to the electrode 412a. The electrode 418b overlaps the pixel electrode 416a and includes a plurality of metal blocks. The shielding layer 418c overlaps the specific line segment 412c. In the embodiment, the shielding layer 418c is used to reduce the influence of the electric field of the specific line segment 412c on the pixel electrode 416a. In the embodiment, the shielding layer 418c is electrically connected to the electrode 412d for receiving a constant voltage. In other embodiments, the electrode 412d receives a ground voltage or a common voltage. The electrodes 418d and 418e serve as common electrodes. In the embodiment, the electrode 418d is electrically connected to the electrode 412e. The electrode 418e overlaps the pixel electrode 416b and includes a plurality of metal blocks. In the embodiment, in addition to increasing the distance DIS between the pixel electrode 416a and the specific line segment 412c, the occurrence of interference due to the electric field of the specific line segment 412c on the pixel electrode 416a can be also reduced further by thinning the insulating layer 417.

A display medium layer 419 is disposed on the electrodes 418a, 418b, 418d, and 418e and the shielding layer 418c. In an embodiment, the display medium layer 419 directly contacts, for example, one portion of the insulating layer 417. In the embodiment, the material type of the display medium in the display medium layer is similar to that of the foregoing embodiment, and, thus, the related description is omitted. A sealant 420 is applied around the hollow region $RG_1$ to seal the display medium layer 419, which reduces the possibility of the liquid-crystal in the display medium layer 419 bleeding out from the hollow region (such as $RG_1$). In this embodiment, the sealant 420 overlaps one portion of the insulating layer 417, however, the present disclosure is not limited thereto. In some embodiments, the sealant 420 is disposed between the hollow region $RG_1$ and the insulating layer 417 to separate the hollow region $RG_1$ from the insulating layer 417. In other some embodiments, the sealant 420 may directly contact an upper substrate 423 or the lower substrate 411.

Two color filter layers 421a and 421b are disposed on the display medium layer 419 to filter out partial colors of light. Two black matrixes 422a and 422b are disposed on the display medium layer 419. In the embodiment, the black matrix 422a overlaps one portion of the color filter layer 421a, and the black matrix 422b overlaps another portion of the color filter layer 421a. In the embodiment, another portion of the color filter layer 421a does not overlap the black matrix 422a or 422b. In addition, the black matrix 422b overlaps one portion of the color filter layer 421b, however, the present disclosure is not limited thereto. In some embodiments, the color filter layer 421a or 421b does not overlap the black matrix 422a or 422b. The upper substrate 423 overlaps the black matrixes 422a and 422b and the color filter layers 421a and 421b. In one embodiment, the upper substrate 423 is a glass substrate, however, the present disclosure is not limited thereto. In the embodiment, the hollow region $RG_1$ penetrates the lower substrate 411, the insulating layers 413, 417, the sealant 420, the black matrix 422b, and the upper substrate 423. In an embodiment, the material of the insulating layers 413 and 417 includes SiNx or SiOx, however, the present disclosure it is not limited thereto.

Figure 4B:
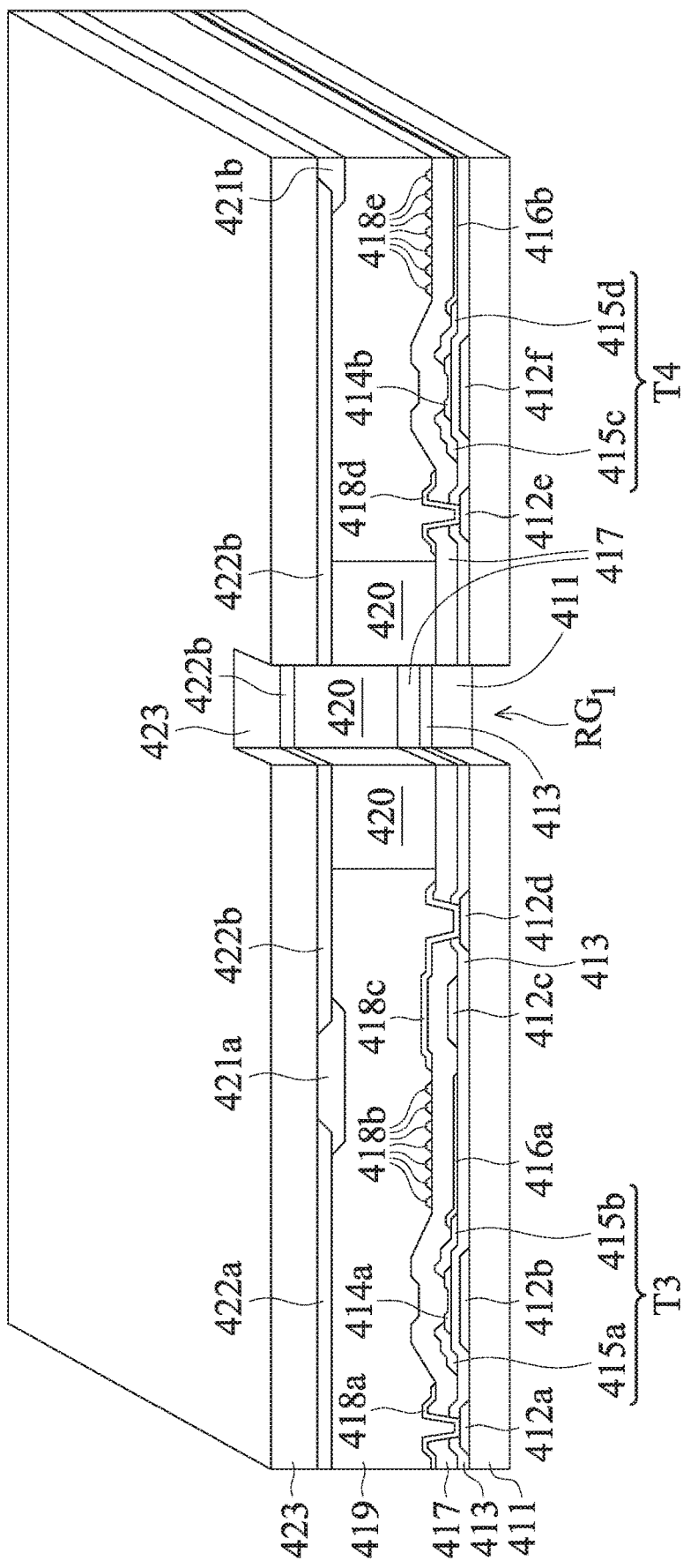
FIG. 4B is a schematic diagram showing a structure of another exemplary embodiment of a structure of an electronic device of the disclosure.

FIG. 4B is a schematic diagram showing a structure of another exemplary embodiment of an electronic device of the disclosure. The components in FIG. 4B are similar to those in FIG. 4A, so the related description will not be repeated. The difference between FIG. 4A and FIG. 4B is that in the electronic device 400B of FIG. 4B, the specific line segment 412c is disposed on the insulating layer 413. In the embodiment, the specific line segment 412c and the pixel electrode 416a are formed by the same process. In one embodiment, the specific line segment 412c and the pixel electrode 416a include the same conductive material. But the disclosure is not limited thereto.

Figure 5:
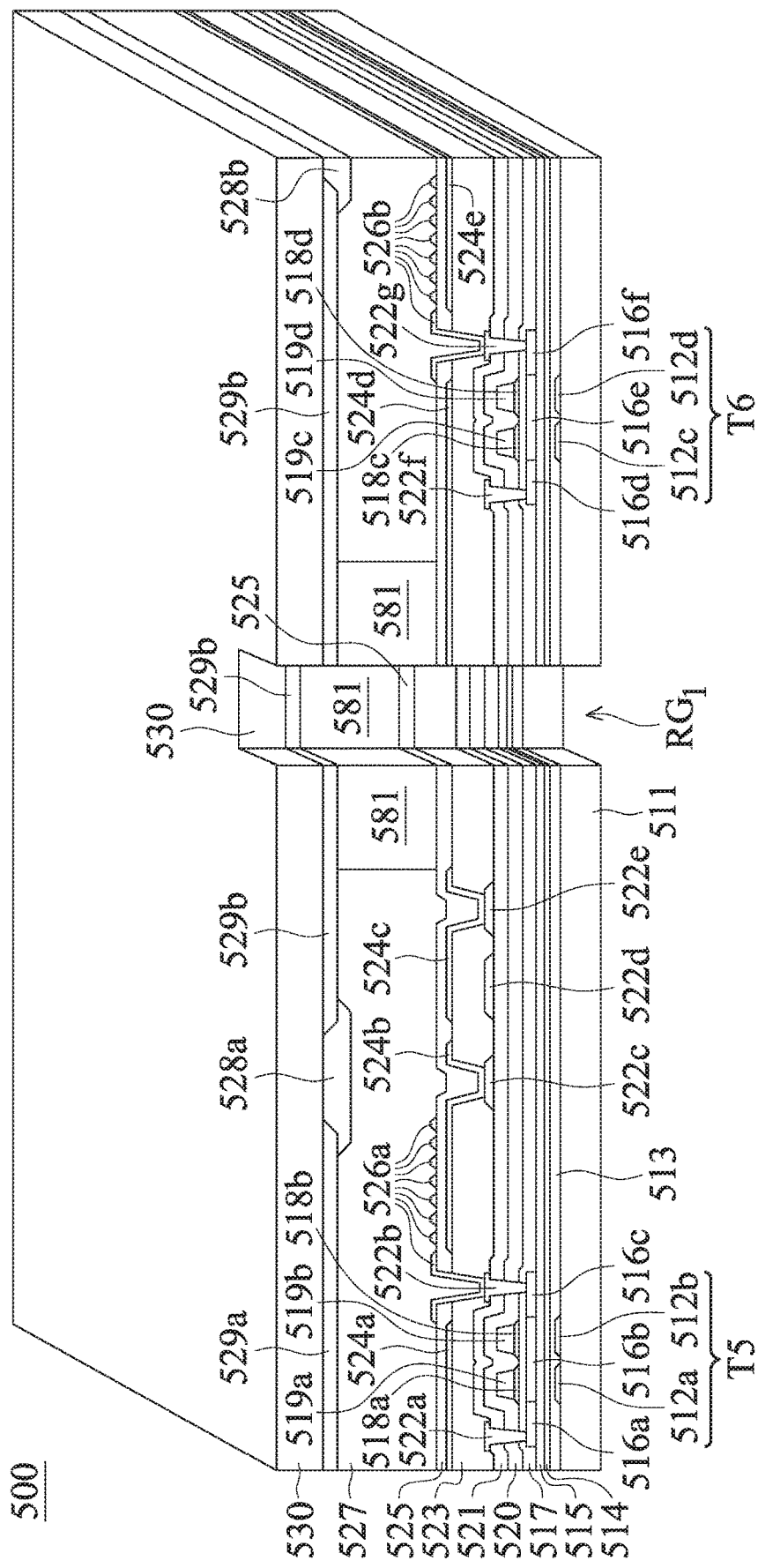
FIG. 5 is a schematic diagram showing a structure of further another exemplary embodiment of a structure of an electronic device of the disclosure.

FIG. 5 is a schematic diagram showing a structure of another exemplary embodiment of an electronic device of the disclosure. As shown in FIG. 5, an electronic device 500 includes a lower substrate 511 and an upper substrate 530. In some embodiments, at least one of the lower substrate 511 and the upper substrate 530 is a hard board (such as a glass substrate), a flexible substrate, or a combination thereof, however, the present disclosure is not limited thereto. Light shielding layers 512a~512d are disposed on the lower substrate 511.

An insulating layer 513 is disposed on the light shielding layers 512a~512d. In the embodiment, the insulating layer 513 directly contacts, for example, one portion of the lower substrate 511. In an embodiment, the material of the insulating layer 513 includes SiNx, however, the present disclosure is not limited thereto. An insulating layer 514 overlaps the insulating layer 513. In an embodiment, the material of the insulating layer 514 includes SiOx, however, the present disclosure is not limited thereto. An insulating layer 515 overlaps the insulating layer 514. In an embodiment, the material of the insulating layer 515 includes SiNx, however, the present disclosure is not limited thereto.

Electrodes 516a~516f are disposed on the insulating layer 515. In this embodiment, a channel layer 516b is disposed between the electrodes 516a and 516c, and a channel layer 516e is disposed between the electrodes 516d and 516f. An insulating layer 517 overlaps the electrodes 516a~516f. In the embodiment, the insulating layer 517 directly contacts, for example, one portion of the insulating layer 515. In an embodiment, the material of the insulating layer 517 includes SiOx, however, the present disclosure is not limited thereto.

Gate dielectric layers 518a~518d are disposed on the insulating layer 517. The electrodes 519a~519d are disposed on the insulating layers 518a~518d respectively. In the embodiment, the electrodes 519a~519d serve as gates. The electrodes 519a, 519b, 516a, and 516c and the channel layer 516b form a transistor T5, wherein the electrodes 519a and 519b serve as the gates of the transistor T5, the electrode 516a serves as the drain of the transistor T5, and the electrode 516c serves as the source of the transistor T5. In other embodiments, the electrode 516a serves as the source of transistor T5, and electrode 516c serves as the drain of transistor T5. In addition, the electrodes 519c, 519d, 516d, and 516f and the channel layer 516e form a transistor T6, wherein the electrodes 519c and 519d serve as the gate of the transistor T6, the electrode 516d serves as the drain of the transistor T6, and the electrode 516f serves as the source of the transistor T6. In other embodiments, the electrode 516d serves as the source of transistor T6, and electrode 516f serves as the drain of transistor T6. However, the transistors of the present disclosure are not limited to the above structure. For example, in some embodiments, only one gate exists in one transistor. In some embodiments, at least one gate of one transistor may be disposed under a channel layer. In other some embodiments, two gates may overlap each other in the normal-line direction of the substrate.

An insulating layer 520 overlaps the electrodes 519a~519d. In the embodiment, the insulating layer 520 directly contacts, for example, one portion of the insulating layer 517. In an embodiment, the material of the insulating layer 520 includes SiOx, however, the present disclosure is not limited thereto. An insulating layer 521 overlaps the insulating layer 520. In an embodiment, the material of the insulating layer 521 includes SiNx, however, the present disclosure is not limited thereto.

Electrodes 522a~522c and 522e~522g and a specific line segment 522d are disposed on the insulating layer 521. In the embodiment, the electrode 522a is electrically connected to the electrode 516a, and the electrode 522b is electrically connected to the electrode 516c. The electrode 522c serves as a common electrode for receiving a common voltage or a ground voltage. The specific line segment 522d is a specific line segment of one signal line in the display area of the electronic device 500 (such as one of $SG_1$~$SG_6$ shown in FIG. 1). The electrode 522e is used to receive a constant voltage. In one embodiment, the electrode 522e receives a ground voltage or a common voltage. The electrode 522f is electrically connected to the electrode 516d, and the electrode 522g is electrically connected to the electrode 516f.

A flattening layer 523 overlaps the electrodes 522a~522c and 522e~522g and the specific line segment 522d. In the embodiment, the flattening layer 523 directly contacts, for example, one portion of the insulating layer 521. Electrodes 524a, 524b, 524d, and 524e and a shielding layer 524c are disposed on the flattening layer 523. In one embodiment, the electrodes 524a and 524b serve as common electrodes. The electrode 524b is electrically connected to the electrode 522c. The shielding layer 524c overlaps the specific line segment 522d to reduce the influence of the electric field of the specific line segment 522d on other electrodes (such as pixel electrodes) or wirings. In the embodiment, the shielding layer 524c is electrically connected to the electrode 522e. The electrodes 524d and 524e serve as common electrodes.

An insulating layer 525 overlaps the electrodes 524a, 524b, 524d, and 524e and the shielding layer 524c. In the embodiment, the insulating layer 525 directly contacts, for example, one portion of the flat layer 523. In an embodiment, the material of the insulating layer 525 includes SiNx, however, the present disclosure is not limited thereto. Pixel electrodes 526a and 526b are disposed on the insulating layer 525. In the embodiment, when the shortest distance between the pixel electrode 526a and the specific line segment 522d becomes longer, the potential of the pixel electrode 526a is less affected by the potential of the specific line segment 522d.

A display medium layer 527 is disposed on the pixel electrodes 526a and 526b. In an embodiment, the display dielectric layer 527 directly contacts, for example, one portion of the insulating layer 525. A sealant 581 is applied around the hollow region $RG_1$ to seal the display medium layer 527, which reduces the possibility of the liquid-crystal in the display medium layer 527 bleeding out from the hollow region $RG_1$. In the embodiment, the sealant 581 overlaps each insulating layer. In some embodiments, the sealant 581 is disposed between the hollow region $RG_1$ and some of the insulating layers to separate the hollow region $RG_1$ from these insulating layers. In some embodiments, the sealant 581 may directly contact the upper substrate 530 or the lower substrate 511. In the embodiment, the material type of the display medium in the display medium layer is similar to that in the previous embodiments, and, thus, the related description is omitted here.

Two color filter layers 528a and 528b are disposed on the display medium layer 527, and are used to filter out partial colors of light. Two black matrixes 529a and 529b are disposed on the display medium layer 527. In the embodiment, the black matrix 529a overlaps one portion of the color filter layer 528a, and the black matrix 529b overlaps another portion of the color filter layer 528a. In the example, another portion of the color filter layer 528a does not overlap the black matrix 529a or 529b. In addition, the black matrix 529b overlaps one portion of the color filter layer 528b. In some embodiments, the color filter layer 528a or 528b does not overlap the black matrix 529a or 529b.

The upper substrate 530 overlaps the black matrixes 529a and 529b and the color filter layers 528a and 528b. In the embodiment, the hollow region $RG_1$ penetrates the lower substrate 511, the insulating layers 513~515, 517, 520, and 521, the flattening layer 523, the insulating layer 525, the sealant 581, the black matrix 529b, and the upper substrate 530. Since the shielding layer 524c overlaps the specific line segment 522d, the interference due to the electric field of the specific line segment 522d on other electrodes or wirings can be reduced.

Figure 6:
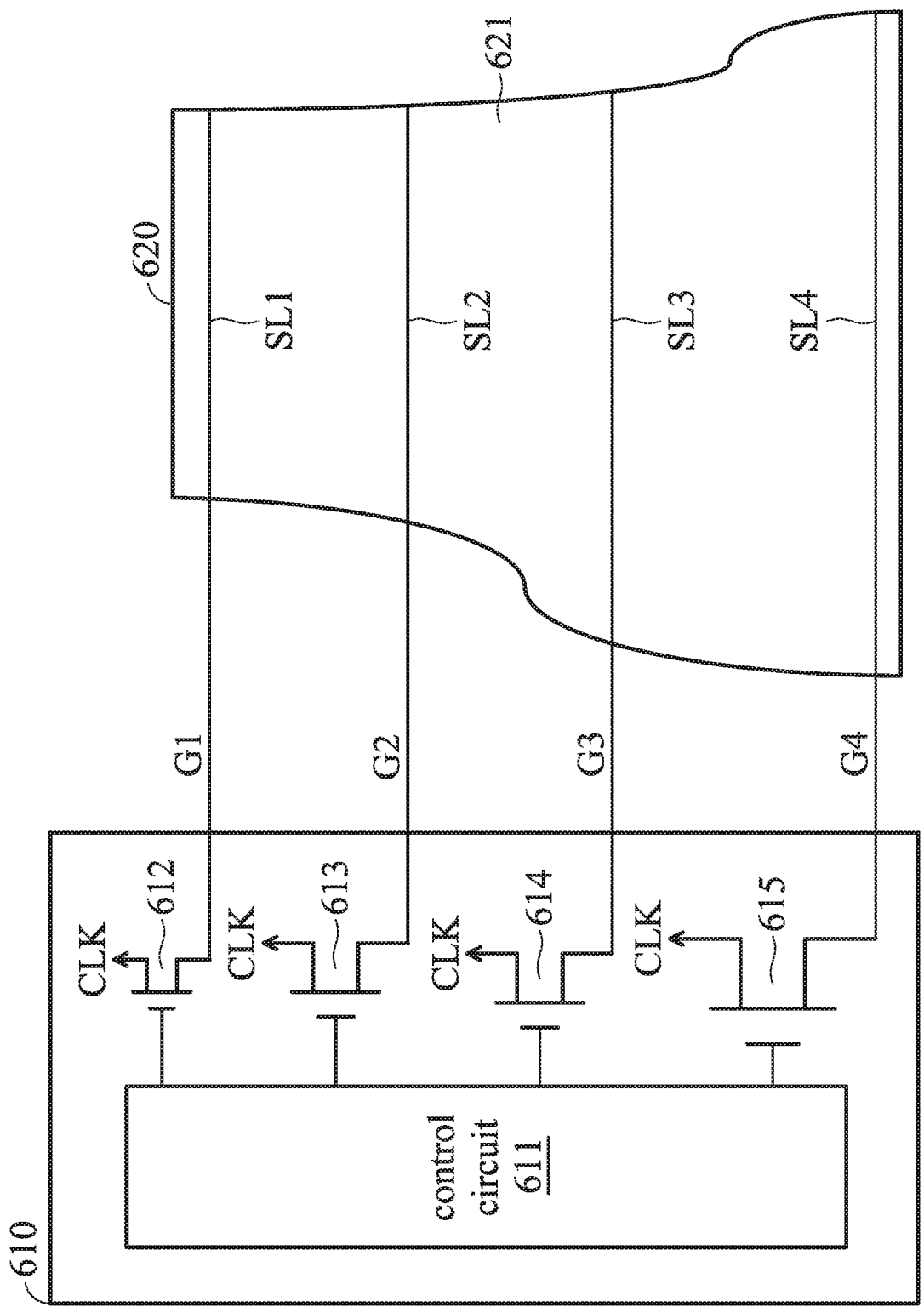
FIG. 6 is a schematic diagram showing an exemplary embodiment of a gate circuit of the disclosure.

FIG. 6 is a schematic diagram of an exemplary embodiment of a gate circuit. As shown in FIG. 6, a gate circuit 610 includes a control circuit 611 and driving elements 612~615. In an embodiment, the control circuit 611 includes at least one shift register circuit for sequentially outputting gate signals, however, the present disclosure is not limited thereto. The present disclosure does not intend to limit the structure of the control circuit 611.

According to the outputs of the control circuit 611 and a clock signal CLK, the driving elements 612~615 provide gate signals G1~G4 for turning on pixels electrically connected to scan lines SL1~SL4 in a display area 621. In the embodiment, all the driving elements 612~615 are N-type transistors. In other embodiments, the driving elements 612~615 may be P-type transistors. In other embodiments, some of the driving elements 612~615 may N-type transistors, and some other driving elements 612~615 are P-type transistors, however, the present disclosure is not limited thereto. Taking the driving element 612 as an example, when the control circuit 611 turns on the driving element 612, the driving element 612 provides a gate signal G1 according to the clock signal CLK. In an embodiment, the driving elements 612~615 can operate as buffers, however, the present disclosure is not limited thereto.

In order to enable the gate signals corresponding to the driving elements to have similar driving capabilities when they reach the pixels on the corresponding scan lines, in an embodiment, the driving elements 612~615 have different sizes to provide the gate signals with different intensities. For example, when the driving element 612 is turned on, the gate signal G1 transmitted through the driving element 612 is different from the gate signal G4 which is transmitted through the driving element 615 when the driving element 615 is turned on. It should be noted that in the embodiment, a transistor serving as one driving element includes a channel region. The channel region has a width W and a spacing L, and the size of the driving element is the ratio between the width W and the spacing L of the channel region (i.e., W/L).

In the embodiment, since the lengths of the scan lines SL1~SL4 of the display area 621 are different, the scan lines having different lengths may have different resistances. At the same time, the different scan lines may have different capacitive loads because they are coupled to different numbers of pixels and across different numbers of data lines. Therefore, in the cases where the respective resistances and capacitive loads of the scan lines may be different, there is some difference between the feedthrough voltages of the gate signals of the different scan lines, which in turn affects the image quality. However, by providing gate signals G1 to G4 with different intensities, the difference between the feedthrough voltages of the scan lines can be compensated.

Taking the gate signals G1 and G4 as an example, since the length of the scan line SL4 is greater than the length of the scan line SL1, the overall load of the scan line SL4 (including a resistance and a capacitive load) is greater than the overall load of the scan line SL1. In this example, since the size of the driving element 615 is greater than the size of the driving element 612, the intensity of the gate signal G4 provided by the driving element 615 is greater than the intensity of the gate signal G1 provided by the driving element 612. Therefore, the difference in the feedthrough voltages between the scan lines SL1 and SL4 can be reduced.

In other embodiments, by changing the loads of the scan lines SL1~SL4, the difference between the feedthrough voltages of the scan lines SL1~SL4 can also be reduced. Taking the scan lines SL1 and SL4 as an example, when the element size of the pixels (not shown) corresponding to the scan line SL4 is smaller than the element size of the pixels corresponding to the scan line SL1, the difference between the feedthrough voltages of the scan lines SL1 and SL4 will become smaller accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the present disclosure has been described by way of example and in terms of the embodiments, it should be understood that the present disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An electronic device, comprising:
    a substrate comprising a display area and a peripheral area;
    a first gate circuit disposed in the peripheral area;
    a second gate circuit disposed in the peripheral area;
    a signal line, coupled between the first gate circuit and the second gate circuit, and comprising a specific line segment, wherein the specific line segment overlaps the display area; and
    a shielding layer, disposed in the display area and overlapping the specific line segment.

2. The electronic device as claimed in claim 1, wherein the substrate is a non-rectangular substrate.

3. The electronic device as claimed in claim 1, further comprising a hollow region disposed in the display area.

4. The electronic device as claimed in claim 1, wherein the shielding layer receives a constant voltage.

5. The electronic device as claimed in claim 4, wherein the constant voltage is a common voltage.

6. The electronic device as claimed in claim 1, further comprising:
    a pixel electrode, wherein the shielding layer is disposed between the pixel electrode and the specific line segment.

7. The electronic device as claimed in claim 1, further comprising:
    a pixel electrode, wherein the pixel electrode does not overlap the specific line segment.

8. The electronic device as claimed in claim 1, wherein the first gate circuit comprises:
    a first driving element providing a first gate signal to a first scan line; and
    a second driving element providing a second gate signal to a second scan line, wherein the first gate signal is different from the second gate signal.

9. The electronic device as claimed in claim 1, further comprising:
    a transistor having a gate, a source, and a drain, wherein a material of the specific line segment is the same as a material of the gate.

10. The electronic device as claimed in claim 1, further comprising:
    a transistor having a gate, a source, and a drain, wherein a material of the specific line segment is the same as a material of the source.

11. An electronic device, comprising:
    a substrate comprising a display area and a peripheral area;
    a first gate circuit, disposed in the peripheral area and transmitting a first scan signal to a first scan line of the display area;
    a second gate circuit, disposed in the peripheral area and transmitting a second scan signal to a second scan line of the display area;
    a data circuit, disposed between the first gate circuit and the second gate circuit and transmitting an image signal to a data line of the display area;
    a signal line, coupled between the first gate circuit and the second gate circuit, and transmitting a control signal and comprising a specific line segment, wherein the specific line segment overlaps the display area; and
    a shielding layer, disposed in the display area and overlapping the specific line segment.

12. The electronic device as claimed in claim 11, wherein the substrate is a non-rectangular substrate.

13. The electronic device as claimed in claim 11, further comprising a hollow region disposed in the display area.

14. The electronic device as claimed in claim 11, wherein the shielding layer receives a constant voltage.

15. The electronic device as claimed in claim 14, wherein the constant voltage is a common voltage.

16. The electronic device as claimed in claim 11, further comprising:
    a pixel electrode, wherein the shielding layer is disposed between the pixel electrode and the specific line segment.

17. The electronic device as claimed in claim 11, further comprising:
    a pixel electrode, wherein the pixel electrode does not overlap the specific line segment.

18. The electronic device as claimed in claim 11, wherein the first gate circuit comprises:
    a first driving element providing a first gate signal to the first scan line; and
    a second driving element providing a second gate signal to a second scan line, wherein the first gate signal is different from the second gate signal.

19. The electronic device as claimed in claim 11, further comprising:
    a transistor having a gate, a source, and a drain, wherein a material of the specific line segment is the same as a material of the gate.

20. The electronic device as claimed in claim 11, further comprising:
    a transistor having a gate, a source, and a drain, wherein a material of the specific line segment is the same as a material of the source.

* * * * *